(12) United States Patent
Llewellyn

(10) Patent No.: US 6,724,248 B2
(45) Date of Patent: Apr. 20, 2004

(54) DC OFFSET SELF-CALIBRATION SYSTEM FOR A DIGITAL SWITCHING AMPLIFIER

(75) Inventor: William D. Llewellyn, San Jose, CA (US)

(73) Assignee: Tripath Technology, Inc., Santa Clara, CA (US)

(*) Notice: Subject to any disclaimer, the term of this patent is extended or adjusted under 35 U.S.C. 154(b) by 103 days.

(21) Appl. No.: 10/127,357

(22) Filed: Apr. 19, 2002

(65) Prior Publication Data

US 2002/0186075 A1 Dec. 12, 2002

Related U.S. Application Data

(60) Provisional application No. 60/286,237, filed on Apr. 24, 2001.

(51) Int. Cl.[7] ............... H03F 1/02; G01R 19/00; H03K 17/00; H03L 5/00
(52) U.S. Cl. ............... 330/9; 330/2; 327/124; 327/307
(58) Field of Search ............... 330/2, 9; 327/124, 327/307

(56) References Cited

U.S. PATENT DOCUMENTS

| | | |
|---|---|---|
| 4,495,470 A | 1/1985 | Bristol ............... 330/9 |
| 5,262,957 A | 11/1993 | Hearn |
| 5,298,898 A | 3/1994 | Brunheim ............... 341/118 |
| 5,631,603 A * | 5/1997 | Stubbe et al. ............... 330/9 |
| 5,757,219 A | 5/1998 | Weedon et al. |
| 5,789,974 A | 8/1998 | Ferguson, Jr. et al. ............... 330/2 |
| 5,867,777 A | 2/1999 | Yamaji et al. ............... 455/234.1 |
| 5,990,734 A | 11/1999 | Wright et al. ............... 330/2 |
| 6,060,262 A * | 5/2000 | Beer-Romero et al. ............... 435/15 |
| 6,140,872 A * | 10/2000 | McEldowney ............... 330/9 |
| 6,141,169 A * | 10/2000 | Pietruszynski et al. ............... 360/67 |
| 6,316,992 B1 | 11/2001 | Miao et al. |

* cited by examiner

*Primary Examiner*—Patricia Nguyen
(74) *Attorney, Agent, or Firm*—Beyer Weaver & Thomas (57) ABSTRACT

A differential amplifier includes first and second outputs and first and second supply rails. The differential amplifier further includes offset cancellation circuitry. The offset cancellation circuitry is operable during a calibration mode to generate an offset cancellation signal when the first and second outputs are both coupled to a voltage between the first supply rail and the second supply rail. The offset cancellation signal is for facilitating at least partial cancellation of an offset voltage associated with the first and second outputs during a normal operation mode of the differential amplifier.

41 Claims, 5 Drawing Sheets

DC OFFSET SELF-CALIBRATION SYSTEM FOR A DIGITAL SWITCHING AMPLIFIER

CROSS-REFERENCE TO RELATED APPLICATIONS

This application claims priority under 35 U.S.C. 119(e) from U.S. Provisional Patent Application No. 60/286,237 (Attorney Docket No. TRIPP036P) for "AN IMPROVED DC OFFSET SELF-CALIBRATION SYSTEM FOR A DIGITAL SWITCHING AMPLIFIER" (Llewellyn) filed on Apr. 24, 2001, which is incorporated herein by reference for all purposes.

BACKGROUND OF THE INVENTION

The present invention relates to DC offset calibration. More specifically, the invention relates to mechanisms for reducing a DC offset voltage associated with an amplifier.

Amplifiers are used in various applications. In some applications, an audio amplifier includes a differential amplifier at its power stage for driving a loudspeaker coupled to the power stage. Such a differential power stage receives differential inputs, and, based on the inputs, drives the loudspeaker. To provide differential inputs to the differential power stage, a comparator having a pair of differential inputs and a pair of differential outputs may be used.

For example, outputs P and N of the (non-hysteretic) comparator are at high and low levels, respectively, when a voltage at an input P of the comparator is higher than a voltage at an input N of the comparator. Conversely, the outputs P and N are at low and high levels, respectively, when a voltage at an input P is lower than a voltage at an input N. In an ideal state, when the inputs P and N are at exactly the same voltage, the outputs P and N would be precisely at the average level of the high and low levels. In this ideal state, the comparator and circuitry associated with the comparator are completely balanced, and symmetric with respect to the two differentially driven inputs/outputs.

However, in reality, a comparator and circuitry associated with the comparator (e.g., a high-gain operational amplifier coupled to the comparator) have a natural tendency to set the outputs P and N at the high and low levels, respectively, or at the low and high levels, respectively, due to intrinsic asymmetries, however small. By way of example, in the above example, when the input P voltage is slightly higher than the input N voltage, the output P may be at the low level due to the tendency caused by the unbalanced or asymmetric circuit parameters. Typically, errors in parameters of various circuit elements, such as operational amplifiers and resistors, cause this imbalance with respect to the two differential inputs/outputs.

The unbalanced condition of the differential amplifier may generate a DC offset voltage at its output ports when it amplifies the input signal in a normal operating mode. In other words, even a small tendency to set one output at high and another output at low while the inputs are balanced (equal) may result in a residual DC component at the outputs in the normal operation mode.

The DC offset voltage causes unnecessary power dissipation during the normal operation mode. Further, the DC offset voltage generates a popping or clicking sound when the output of the amplifier is unmuted. This popping or clicking sound results from the voltage step which occurs when the amplifier abruptly transitions between applying no forcing function upon the load to applying the DC offset voltage.

In view of the above, it would be desirable to provide apparatus and methods for reducing a DC offset in an amplifier, thereby substantially eliminating the popping sound when the amplifier is unmuted, and reducing power dissipation due to the DC offset. The present invention addresses these needs by reducing or substantially canceling a DC offset voltage associated with a differential amplifier.

SUMMARY OF THE INVENTION

According to the present invention, a differential amplifier has first and second outputs and first and second supply rails. The differential amplifier further includes offset cancellation circuitry. The offset cancellation circuitry is operable during a calibration mode to generate an offset cancellation signal when the first and second outputs are both coupled to a calibration voltage between the first supply rail and the second supply rail. The differential amplifier cancels at least a part of an offset voltage associated with the first and second outputs during a normal operation mode based on the offset cancellation signal.

Alternatively, according to the present invention, a differential amplifier has first and second outputs and first and second supply rails. The differential amplifier further includes offset cancellation circuitry. The offset cancellation circuitry is operable during a calibration mode to generate a first offset cancellation signal when the first and second outputs are coupled to the first supply rail, and a second offset cancellation signal when the first and second output are coupled to the second supply rail. The offset cancellation circuitry is also operable during the calibration mode to generate a third offset cancellation signal by averaging the first and second offset cancellation signals. The differential amplifier cancels at least a part of an offset voltage associated with the first and second outputs during a normal operation mode based on the third offset cancellation signal.

In a specific embodiment, the first and second supply rails supply a power supply voltage and a ground voltage, respectively, and the calibration voltage is substantially an average of the power supply voltage and the ground voltage.

In another embodiment, the differential amplifier further includes a signal processor block, comparator circuitry, and a switching amplifier. The signal processor block is operable to receive an input of the differential amplifier and the offset cancellation signal, and generate an output signal. The comparator circuitry is operable to convert the output signal into a binary signal. The switching amplifier is operable to amplify the binary signal, and generate the first and second outputs.

In still another embodiment, the differential amplifier includes a plurality of sets of the signal processor block, the comparator circuitry, and the switching amplifier corresponding to a plurality of channels. The offset cancellation circuitry may be operable to generate a plurality of the offset cancellation signals corresponding to the plurality of channels.

In still another embodiment, the differential amplifier includes a successive approximation type analog-to-digital converter, and a digital-to-analog converter. The successive approximation type analog-to-digital converter is operable to generate offset compensation data based on the offset voltage. The digital-to-analog converter is operable to receive the offset compensation data, generate an offset compensation voltage based on the offset compensation data, and apply the offset compensation voltage to an input of the differential amplifier.

According to another aspect of the invention, a method for reducing an offset voltage of a differential amplifier is provided. The differential amplifier includes first and second outputs and first and second supply rails. The method generates an offset cancellation signal when the first and second outputs are both coupled to a voltage between the first supply rail and the second supply rail during a calibration mode of the differential amplifier. The method applies the offset cancellation signal to an input of the differential amplifier for facilitating at least partial cancellation of the offset voltage associated with the first and second outputs during a normal operation mode of the differential amplifier.

According to still another aspect of the invention, the method generates a first offset cancellation signal when the first and second outputs are coupled to the first supply rail, and a second offset cancellation signal when the first and second output are coupled to the second supply rail during a calibration mode of the differential amplifier. The method generates a third offset cancellation signal by mathematically combining the first and second offset cancellation signals. The method applies the third offset cancellation signal to an input of the differential amplifier for facilitating at least partial cancellation of the offset voltage associated with the first and second outputs during a normal operation mode of the differential amplifier.

A further understanding of the nature and advantages of the present invention may be realized by reference to the remaining portions of the specification and the drawings.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF SPECIFIC EMBODIMENTS

Various embodiments of the present invention will now be described in detail with reference to the drawings, wherein like elements are referred to with like reference labels throughout.

Figure 1:
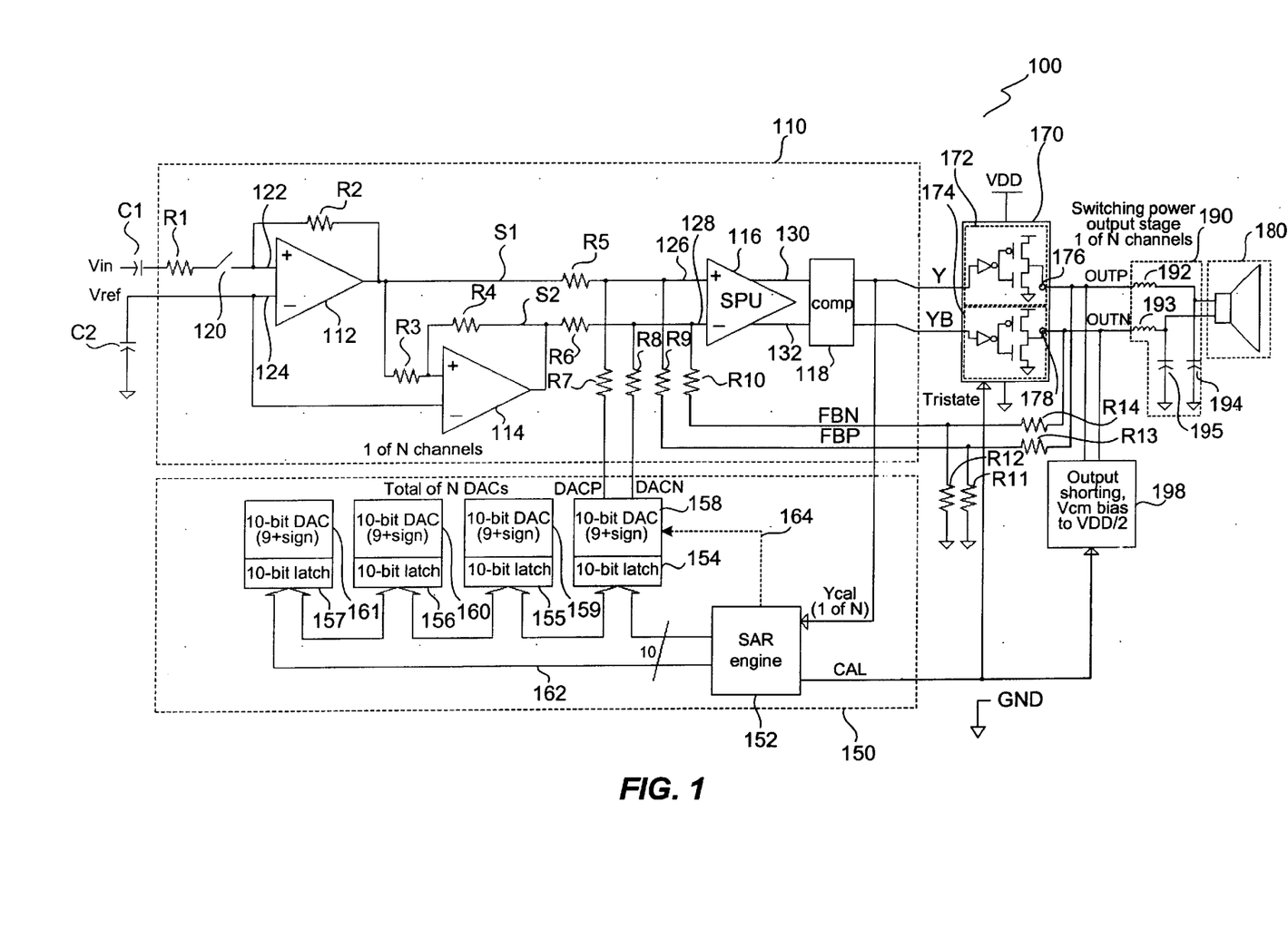
FIG. 1 is a block diagram of a differential amplifier according to an embodiment of the present invention.

FIG. 1 is a block diagram of a differential amplifier 100 according to an embodiment of the present invention. The differential amplifier 100 includes a signal processor 110, a power stage 170, and offset cancellation circuitry 150. The signal processor 110 receives an input signal Vin at its input port, and based on the input signal, generates a pair of digital signals Y and YB for differentially driving the power stage 170. The power stage 170 receives the signals Y and YB, and drives a load 180 by output signals OUTP and OUTN.

The differential amplifier 100 has two operation modes: a calibration mode and a normal operation mode. During the calibration mode, the offset cancellation circuitry 150 receives at least one signal from the signal processor 110, and determines a value of an offset cancellation signal for facilitating at least partial cancellation of an offset voltage associated with the signals OUTP and OUTN. During the normal operation mode, the offset cancellation circuitry 150 applies to the signal processor 110 the offset cancellation signal based on the value determined during the calibration mode. Thus, the differential amplifier 100 is capable of minimizing the offset voltage associated with the signals OUTP and OUTN during the normal operation mode based on the offset cancellation signal determined during the calibration mode.

The signal processor 110 includes operational amplifiers 112 and 114, and signal processing unit (SPU) 116, a comparator 118, a switch 120, and resistors R1–R10. Each of the operational amplifiers 112, 114 and SPU 116 has a non-inverting input and an inverting input. Each of the operational amplifiers 112 and 114 has a single output, and the SPU 116 has positive and negative outputs which are differentially driven. Each of the operational amplifiers 112, 114 and SPU 116 has a suitable gain for amplifying the input signal Vin received at the input port of the signal processor 110, and driving differential input ports of the comparator 118. For example, in a specific embodiment, the SPU 116 has a very high effective open-loop gain such as 60–80 dB. Resistors R1–R10 are determined based on various factors including gain considerations and suitable biasing requirements of each active element in the signal processor 110.

A capacitor C1 couples the input port at which the input signal Vin is received to an input 122 via the resistor R1 and the switch 120. The switch 120 opens during the calibration mode, and closes during the normal operation mode. A capacitor C2 couples an input 124 to a ground voltage GND. In various embodiments of the invention, the input signal Vin is an analog audio signal which has frequency components ranging from about 10 Hz to about 25 kHz. However, it should be appreciated that other embodiments of the invention may amplify analog and/or digital signals having frequency components other than the audio frequency range, such as RF (radio frequency) components. Stated differently, embodiments of the invention may amplify signals having any frequency components ranging from the audio frequency to GHz frequency bands.

The SPU 116 has a non-inverting input 126 and an inverting input 128. The operational amplifier 112 outputs a signal S1 to the non-inverting input 126 via the resistor R5. The operational amplifier 114 outputs a signal S2 to the inverting input 128 via the resistor R6. The non-inverting input 126 of the SPU 116 receives the signal S1, an offset cancellation signal DACP from the offset cancellation circuitry 150 via R7, and a feedback signal FBP from the power stage 170 via resistors R9 and R13. The inverting input 128 of the SPU 116 receives the signal S2, an offset cancellation signal DACN from the offset cancellation circuitry 150 via R8, and a feedback signal FBN from the power stage 170 via resistors R10 and R14. The SPU 116 processes the differential signals received at the inputs 126 and 128, and outputs two differential signals at outputs 130 and 132. The outputs 130 and 132 differentially drive the comparator 118.

The comparator 118 compares the two differential signals received from the outputs 130 and 132 of the SPU 116, and outputs the signal Y and YB. Ideally, the signals Y and YB are at a high level and a low level, respectively and on average, when a voltage at the input 126 is higher than a voltage at the input 128. Conversely, the signals Y and YB are at the low level and the high level, respectively and on average, when the voltage at the input 126 is lower than the voltage at the input 128. In a specific embodiment, the high level is 5.0 V with respect to the ground voltage GND, and the low level is the same as the ground voltage GND. However, the high and low levels may be set to any suitable voltages.

The power stage 170 receives the signals Y and YB, and drives the load 180 via a filter 190. The power stage 170 includes switches 172 and 174. The switch 172 (i) couples an output 176 to a power supply voltage VDD when the input signal Y is equal to or higher than a threshold, (ii) couples the output 176 to the ground voltage GND when the input signal Y is lower than the threshold, and (iii) tristates the output 176 when a signal CAL is activated irrespective of the input signal Y. The "tristated" output is decoupled from both the power supply voltage VDD and the ground voltage GND, and maintained in a high impedance state. Similarly, the switch 174 (i) couples an output 178 to a power supply voltage VDD when the input signal YB is equal to or higher than a threshold, (ii) couples the output 178 to the ground voltage GND when the input signal YB is lower than the threshold, and (iii) tristates the output 178 when a signal CAL is activated irrespective of the input signal YB. Each of the switches 172 and 174 includes totem pole connected transistors and an inverter. In this specific embodiment, the totem pole connected transistors in the switches 172 and 174 are a pair of an n-type MOSFET (metal oxide semiconductor field effect transistor) and a p-type MOSFET. However, the switches 172 and 174 may use any suitable FETs. Further, the switches 172 and 174 may use any suitable switching circuit architecture. The power stage 170 includes circuitry for tristating the outputs 176 and 178 when the signal CAL is activated.

In this specific embodiment, the load 180 includes a loudspeaker since the signal processor 110 amplifies an analog audio signal. However, the differential amplifier 100 may amplify various signals other than analog audio signal such as motor control, solenoid control, electro mechanical positioner, a digital signal, and an RF signal. The load 180 may be inductive, capacitive, resistive, or any combination thereof. Specifically, the load 180 may include, but is not limited to, a motor, an LCD (liquid crystal display) panel, a piezoelectric actuator (e.g., an inkjet printer head), an antenna for wireless communication, and a transformer.

The filter 190 smoothes the output signals OUTP and OUTN, thereby eliminating undesirable frequency components for the load 180. Thus, the filter 190 includes inductors 192 and 193, and capacitors 194 and 195 of which parameters are selected to eliminate components unnecessary for use of the differential amplifier 100 as an audio amplifier. It should be appreciated that the filter 190 may adopt any suitable filter architecture/parameters to achieve desirable filtering characteristics for the load 180 and the user of the system 100. In some embodiments, the filter 190 may be omitted depending on the nature of the load 180 and the output signals OUTP and OUTN, and/or the purposes of the system 100.

In a specific embodiment, the power supply voltage VDD is about 14 V with respect to the ground voltage GND. However, the power supply voltage VDD may be any suitable voltage with respect to the ground voltage GND.

In a specific embodiment, the GND terminal associated with power stage 170 is 0 V. However, this GND terminal associated with power stage 170 may be any suitable voltage including a negative voltage.

The offset cancellation circuitry 150 receives a signal Ycal from the output of the comparator 118. During the calibration mode, the offset cancellation circuitry 150 determines a value corresponding to the offset cancellation signal for canceling at least part of the offset voltage associated with the signals OUTP and OUTN. In this embodiment, the calibration mode is activated when the user turns on the power switch of the differential amplifier 100, or enables the amplifier to enter normal operation from having been in a disabled, bypassed, or non-operative "sleep" mode. In other words, the calibration mode is not continuous, nor real-time. Once the offset cancellation circuitry 150 determines the value corresponding to the offset cancellation signal, the offset cancellation circuitry 150 stores or maintains the value during the normal operation mode for applying an offset cancellation signal based on the stored or maintained value for offset cancellation.

According to a specific embodiment, the offset cancellation circuitry 150 includes an SAR (successive approximation register) engine 152, 10-bit latches 154–157, 10-bit DACs (digital-to-analog converters) 158–161, and a bus 162. The differential amplifier 100 includes n sets of the signal processor 110, the 10-bit latch 154, the 10-bit DAC 158, the power stage 170, the load 180, the filter 190, and associated circuitry (e.g., the resistor network including R11–R14) in order to provide a system having n channels. FIG. 1 shows only the circuitry associated with one such channel for the sake of simplicity.

In this embodiment, there is only single SAR engine (i.e., the engine 152) in the offset cancellation circuitry 150. However, the SAR engine 152 determines n offset cancellation signals for the n channels sequentially during the calibration mode. The SAR engine 152 then utilizes the n offset cancellation signals during the normal operation mode for separate offset cancellation applied to the n channels of amplification. In a specific embodiment, n is four. However, n may be other numbers including one. In other embodiments, there may be a plurality of SAR engines; for example, one per amplification channel.

Figure 2:
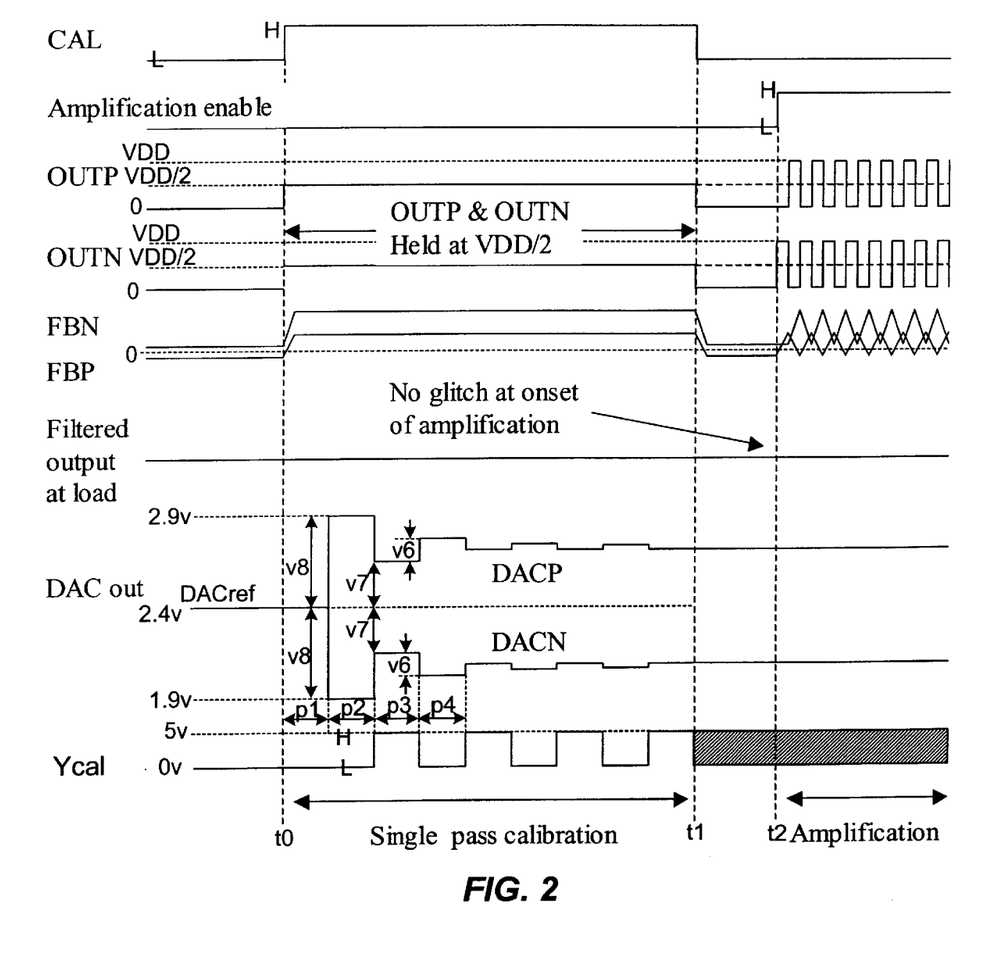
FIG. 2 is a timing diagram illustrating signals in the block diagram of the embodiment shown in FIG. 1.

FIG. 2 is a timing diagram illustrating signals in the block diagram of the embodiment shown in FIG. 1. It should be noted that for the purpose of brevity, FIG. 2 does not show calibration for all 10 bits of the 10-bit process described below. Now, referring to FIGS. 1 and 2, a method for reducing an offset voltage of a differential amplifier will be described in detail. At t0, a power switch of the differential amplifier 100 is turned on. During a time period t0–t1, the SAR engine outputs the signal CAL which is at the high level to the power stage 170, and a controller 198. Upon receiving the signal CAL at the high level, the power stage 170 tristates the outputs 176 and 178, and the controller 198 couples the outputs 176 and 178 to a voltage between the power supply voltage VDD and the ground voltage GND. In this embodiment, the outputs 176 and 178 are set at a voltage which is substantially an average of the power supply voltage VDD and the ground voltage GND, i.e., VDD/2. However, in some embodiments, the outputs 176 and 178 may be set at any suitable voltage.

During the time period t0–t1, the SAR engine 152 receives the signal Ycal from the output of the comparator 118. The SAR engine 152 determines a 10-bit value corresponding to the signals DACP and DACN. Here, the signals DACP and DACN are differentially driven with respect to a voltage DACref (2.4 V in this specific embodiment). The 10-bit value includes one bit (b9) representing a sign of the signals (DACP-DACref) and (DACN-DACref), and nine bits (b8–b0) representing an absolute value of the signals (DACP-DACref) and (DACN-DACref). The i-th bit (i=0, 1, 2, . . . , 8) in the nine bits has a weight of $2^i$. The bits b8–b0 correspond to the range from −512 to +512. Therefore, each of the signals (DACP-DACref) and (DACN-DACref) has resolution corresponding to an integer value ranging from −512 to +512. It should be appreciated that an actual voltage range which the signals (DACP-DACref) and (DACN-DACref) cover may be modified depending on the SPU 116 or a possible range of the offset voltage caused at the signals OUTP and OUTN. It should be appreciated that the center voltage DACref may be shifted to other voltage potential levels.

The inputs 126 and 128 are differentially driven. The offset cancellation circuitry 150 applies the signals DACP and DACN to the non-inverting input 126 and the inverting input 128, respectively. The signal (DACP-DACref) and the signal (DACN-DACref) have the same absolute value, but have opposite signs. Stated differently, the signals DACP and DACN are symmetrical with respect to the voltage DACref (e.g., 2.4 V in this embodiment) as shown in FIG. 2.

First, at the beginning of a time period p1, the offset cancellation circuitry 150 sets the 10-bit bus 162 to all zeroes, and DAC 158 responds with DACP-DACref= DACN-DACref=0V. (The sign bit is immaterial when all other bits b8–b0 are low since the DAC output is zero in this condition.) At the very end of time period p1, the comparator 118 is strobed and its output state is made current on the signal line Ycal. (Prior to this strobing event, Ycal was simply held at the previous strobed state of the comparator.) The offset cancellation circuitry 150 sets the sign bit b9 to "0" because the signal Ycal is "L" (i.e., at the low level). The signal Ycal at L at the end of the time period p1 means that the system has a natural tendency to set the output Y to L. Thus, the offset cancellation signal DACP must be higher than the DACref (e.g., 2.4 V). In other words, the signal (DACP-DACref) must be a positive voltage. Conversely, if the signal Ycal at the end of the period p1 is "H" (i.e., at the high level), the offset cancellation signal DACP must be lower than the DACref (e.g., 2.4 V). In other words, the signal (DACP-DACref) must be a negative voltage. If the signal Ycal at the end of the period p1 had been "H", the offset cancellation circuitry 150 would have set the sign bit b9 to "1".

Next, at the beginning of a time period p2, the offset cancellation circuitry 150 sets the bit b8 to "1" temporarily for approximation, and applies an offset cancellation signal corresponding to the bit b8 of "1" to the inputs 126 and 128 as the signals DACP and DACN. The absolute values of the signals (DACP-DACref) and (DACN-DACref) are v8 corresponding to the bit b8 having "1." Here, the sign bit has been determined to "0" indicating that the signal (DACP-DACref) is positive (i.e., more than 0 V), and that the signal (DACN-DACref) is negative (i.e., less than 0 V). Thus, in such a case, the signals (DACP-DACref) and (DACN-DACref) have a value of "+v8," and a value o "−v8," respectively. When the sign bit is "0" indicating that the signal (DACP-DACref) is negative, and that the signal (DACN-DACref) is positive. Thus, in such a case, the signals (DACP-DACref) and (DACN-DACref) would have a value of "−v8," and a value of "+v8," respectively.

At the end of time period p2, the comparator 118 is strobed, its output state is made current on the signal line Ycal, and the offset cancellation circuitry 150 checks the level of the signal Ycal. If the signal Ycal is at H, the offset cancellation circuitry 150 sets the bit b8 to "0" as a result of the approximation since the signal Ycal at H means that the offset cancellation signal is too large for canceling the offset voltage. If the signal Ycal still stays at L, the offset cancellation circuitry 150 maintains and latches the bit b8 at "1" since the unchanged Ycal means that the offset cancellation signal is still too small for canceling the offset voltage. Here, as shown in FIG. 2, the signal Ycal is at H at the end of time period p2. Thus, the offset cancellation circuitry 150 sets the bit b8 to "0."

Then, the offset cancellation circuitry 150 sets the bit b7 to "1" temporarily for approximation during the time period p3. The offset cancellation circuitry 150 generates 10-bit data in which the bits b9–b0="+010000000." Stated differently, the signal (DACP-DACref) corresponds to a summation of 2^i (i=0, 1, . . . , 8), each of which is weighted by each bit bi (i=0, 1, . . . , 8) having a sign corresponding to the bit b9 ("+" if b9="1", and "−" if b9="0"). The signal (DACN-DACref) is an inverted version of the signal (DACP-DACref).

Therefore, there is the following relationship between the 10-bit data and the signals (DACP-DACref) and (DACN-DACref):

$$(DACP\text{-}DACref)=C\cdot sign(b9)\cdot(b8\cdot 2^{\wedge}8+b7\cdot 2^{\wedge}7+ \ldots +b0\cdot 2^{\wedge}0)$$

$$(DACN\text{-}DACref)=-C\cdot sign(b9)\cdot(b8\cdot 2^{\wedge}8+b7\cdot 2^{\wedge}7+ \ldots +b0\cdot 2^{\wedge}0)$$

where
C=a constant coefficient; and
sign(bit)="+" if bit=1, and "−" if bit=0. . . . (1)

The SAR engine 152 generates the 10-bit value based on the signal Ycal, and outputs the data to the 10-bit latch 154. The 10-bit latch 154 stores the 10-bit value. Based on a control signal 164, the 10-bit DAC 158 retrieves the 10-bit value, and generates the offset cancellation signals DACP and DACN for applying to the inputs 126 and 128.

During the rest of the time period p3, the signals (DACP-DACref) and (DACN-DACref) have a voltage v7. During the time period p2, the signals (DACP-DACref) and (DACN-DACref) have a voltage v8. The voltage v7 is half of the voltage v8 since the bit b7 has a half of the weighting value of the bit b8 as expressed in the above-described Expression (1) and in this particular example b8 was reset to "0" during the SAR's testing of b7.

Next, at the end of time period p3, comparator 118 is strobed, its output state is made current on the signal line Ycal, and the offset cancellation circuitry 150 checks the level of the signal Ycal. Similar to the approximation done at the end of time period p2, if the signal Ycal is at H, the offset cancellation circuitry 150 sets the bit b7 to "0" as a result of the approximation since the signal Ycal at H means that the offset cancellation signal is too large for canceling the offset voltage. If the signal Ycal is L, the offset cancellation circuitry 150 sets the bit b7 to "1" since the unchanged Ycal means that the offset cancellation signal is still small for canceling the offset voltage. Here, the signal Ycal is at L at the end of time period p3. Thus, the offset cancellation circuitry 150 sets the bit b7 to "1" as a result of the approximation for the bit b7.

During the time period p4, the offset cancellation circuitry 150 applies an offset cancellation signal corresponding to the bits b9–b0 of "+011000000." Repeating the above-described scheme for approximation ultimately determines all of the bits b9–b0, which represent a sign and an absolute value corresponding to the signals (DACP-DACref) and (DACN-DACref) at the time t1.

The SAR engine 152 then outputs the determined bits b9–b0 to the 10-bit latch 154 via the bus 162. The bus 162 has at least a 10-bit width for sending 10-bit data representing the offset cancellation signal. The 10-bit latch 154 receives the 10-bit data including the bits b9–b0, and stores the 10-bit data. The 10-bit DAC 158 receives the stored 10-bit data, and generates the signals DACP and DACN. As described in detail earlier, the signals (DACP-DACref) and (DACN-DACref) correspond to the 10-bit data including the bits b9–b0.

The 10-bit DAC 158 applies the signals DACP and DACN to the inputs 126 and 128, respectively, based on a control signal 164 generated by the SAR engine 152 during the normal operation mode after the time t2. The control signal 164 controls the application of the signals DACP and DACN. Control signals similar to the control signal 164, which are omitted in FIG. 1 for the sake of simplicity, are applied to the 10-bit DACs 159–161 from the SAR engine 152. The switch 120 closes when the signal Amplification Enable in FIG. 2 is H, and opens when the signal Amplification Enable in FIG. 2 is L.

In order to determine a precise value (e.g., a voltage in this embodiment) of the offset cancellation signal, the offset cancellation signal should be determined in a circuit condition which is sufficiently close to the actual one, in which the outputs 176 and 178 are alternately coupled to VDD and GND in a complementary manner. For example, in one time period, the outputs 176 and 178 are at H and L, respectively, and in a next time period, the outputs 176 and 178 are at L and H, respectively. In order to simulate this real operating condition, the embodiment shown in FIGS. 1 and 2 couples the outputs 176 and 178 of the power stage 170 to an average point (or, a medium point) of the power supply voltage VDD and the ground voltage GND. Consequently, a filtered output at the load 180 experiences little or no glitch at the onset of amplification (i.e., the time t2). Thus, various embodiments of the present invention may be capable of reducing a DC offset in an amplifier, thereby substantially eliminating the popping sound when the amplifier is unmuted, and reducing power dissipation due to the DC offset.

As shown in FIG. 2, the signals FBP and FBN shows larger deviation from the 0 V level during the calibration mode (i.e., the time period t0–t1) as compared to a state before the time t0. This deviation is due to unbalanced parameters in the differential amplifier 100 with respect to the two differentially driven signal paths. Therefore, the embodiments shown in FIGS. 1 and 2 may be desirable where, for example, calibration for the offset cancellation signal need to be performed in a simulated condition. Such a simulated condition may generate an offset cancellation signal with more precision.

The SAR engine 152 performs the above-described successive approximation for each of the channels sequentially. Thus, each of the 10-bit latches 154–147 ultimately stores a 10-bit word corresponding to the signals DACP and DACN for canceling an offset voltage associated with the outputs of each channel. FIG. 2 shows only a single successive approximation process during the time period t0–t1. However, it should be appreciated that the differential amplifier 100 may perform a plurality of successive approximation processes for a plurality of channels before amplification begins at a time t2.

In this specific embodiment, the data representing the voltages of the signals DACP and DACN have a length of 10 bits. However, in some embodiments, the offset cancellation signal may correspond to an n-bit word, where n is restricted to some minimum value only by maximum allowable amplifier system output offset requirements or to some maximum value by practical design limitations.

In this specific embodiment shown in FIG. 1, the offset cancellation circuitry 150 determines a digital value expressed by a 10-bit data which corresponds to a voltage value of the offset cancellation signal applied to the signal processor 110. However, in other embodiments, the offset cancellation circuitry 150 may determine a digital value which corresponds to a current value of the offset cancellation signal applied to the signal processor 110.

Various functional blocks in embodiments of the present invention including the signal processor 110, and the offset cancellation circuitry 150 may be implemented either by separate circuit components or elements, or by a single, integrated component. By way of example, the offset cancellation circuitry 150 may be implemented by, e.g., an ASIC (application specific integrated circuit) as a single unit. In such a case, the offset cancellation circuitry 150 may not be clearly categorized into the functional blocks shown in FIG. 1, such as the SAR engine 152, the 10-bit latches 154–157, and the 10-bit DAC 158–161. In some embodiments, all or a part of functional blocks in the differential amplifier 100 may be implemented as a single functional unit.

In the embodiment shown in FIG. 1, the offset cancellation circuitry 150 utilizes a successive approximation technique. However, it should be appreciated that any suitable approximation techniques can be used for determining an appropriate compensation signal applied to an input port of the amplifier. For example, a ramping technique can be used instead of the successive approximation technique. According to the ramping comparison technique, a signal generator generates a ramping waveform, and applies to the inputs 126 and 128 of the comparator 118. The ramping waveform can be generated by, for example, counting up the bits b9–b0 from the least significant bit to the most significant bit.

For example, the signal generator increments the 10-bit word bit by bit, e.g., −111111111, −111111110, . . . , 0, +000000001, +000000010, . . . , +111111111, in this order, and applies the signals DACP and DACN corresponding to the 10-bit word to the inputs 126 and 128. The offset cancellation circuitry 150 determines that the offset cancellation signal value is the closest to the ideal point when the signal Ycal changes from L to H. Although this method may take a longer time to approximate the offset cancellation signal voltage, a controller necessary for this ramping approximation may be simpler than that of the SAR engine 152. Further, the offset cancellation circuitry 150 may utilize any suitable approximation technique to determine the best offset cancellation signal applied to the input of the signal processor 110.

Figure 3:
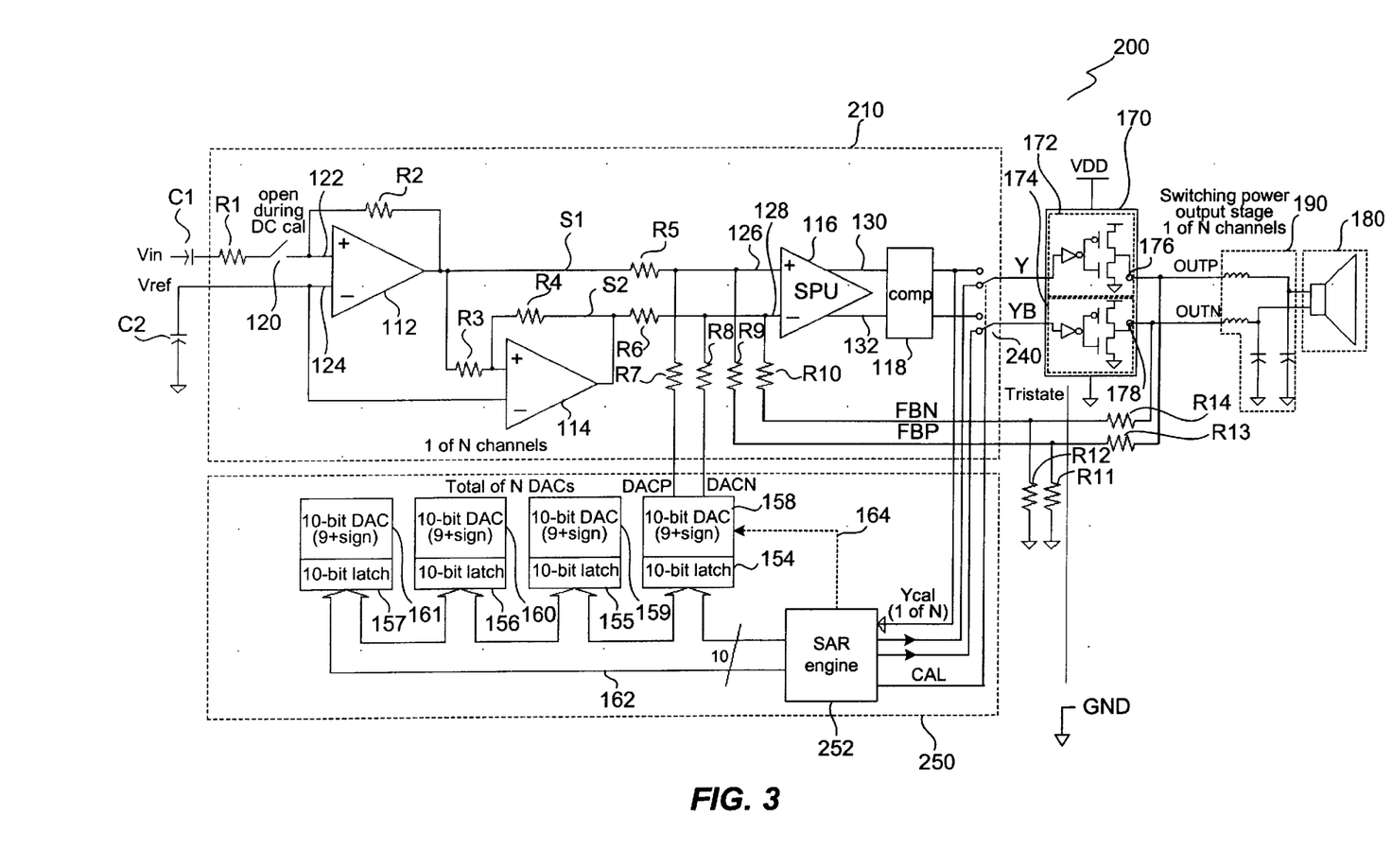
FIG. 3 is a block diagram of a differential amplifier according to another embodiment of the present invention.
Figure 4:
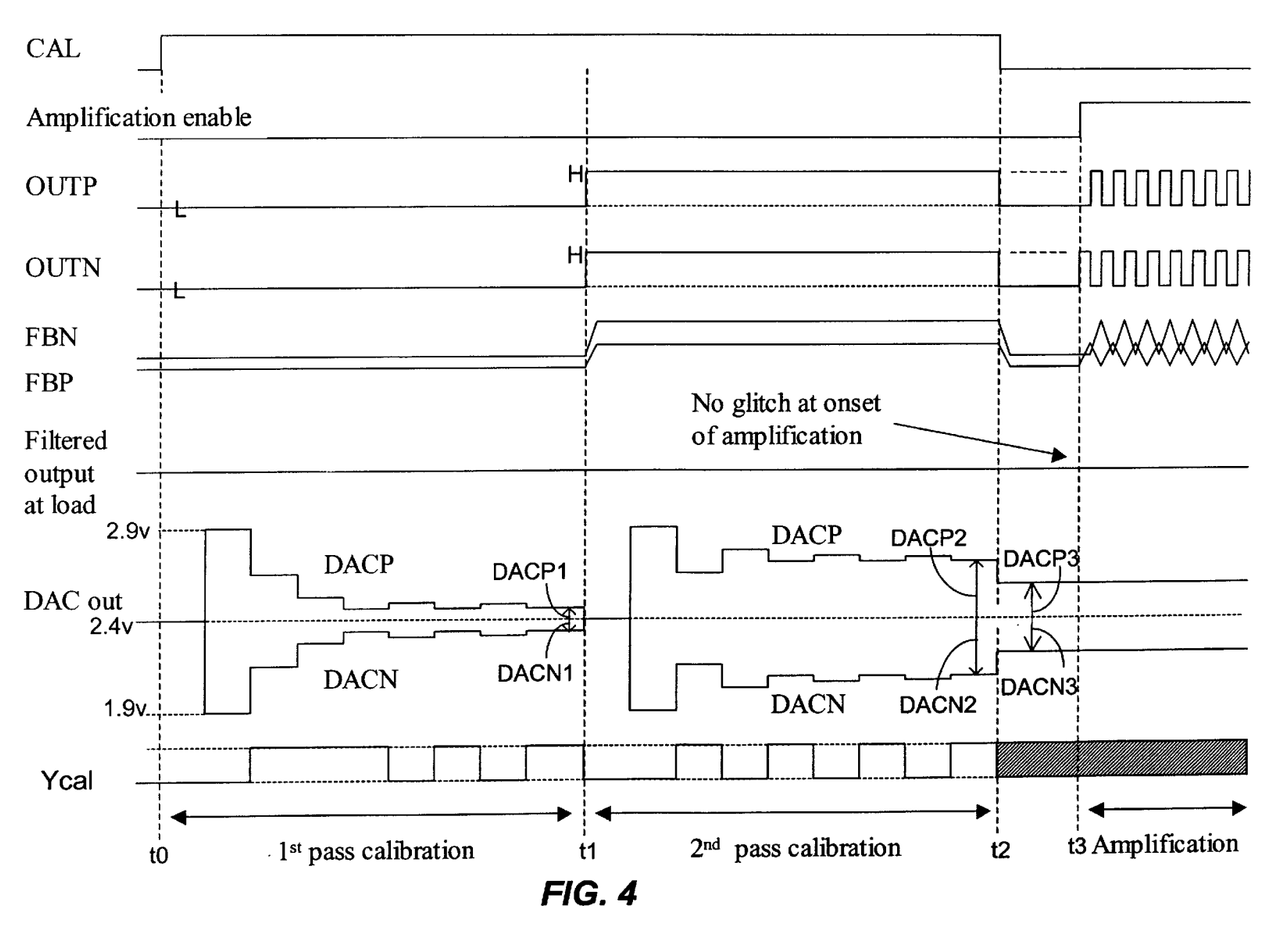
FIG. 4 is a timing diagram illustrating signals in the block diagram of the embodiment shown in FIG. 3.

FIG. 3 is a block diagram of a differential amplifier 200 according to another embodiment of the present invention. FIG. 4 is a timing diagram illustrating signals in the block diagram of the embodiment shown in FIG. 3. In the embodiment shown in FIGS. 1 and 2, the calibration was performed only once before the normal operation mode. Thus, the embodiment of FIGS. 1 and 2 may be called a "single pass calibration" type. As opposed to the single pass calibration, the embodiment described below referring to FIGS. 3 and 4 performs a "two pass calibration."

When the power switch of a differential amplifier 200 is turned on at a time t0, the SAR engine 252 sets the signal CAL to H. A signal processor 210 includes a switch 240. The switch 240 couples the inputs of the switches 172 and 174 to the outputs of the comparator 118 when the signal CAL is L (i.e., during the normal operation mode). A switch 240 couples the inputs of the switches 172 and 174 to the SAR engine 252 when the signal CAL is H (i.e., during the calibration mode). Thus, during the calibration mode, the SAR engine 252 drives the signals Y and YB which in turn drive the switches 172 and 174.

During a time period t0–t1 (a "first pass calibration"), the offset cancellation circuitry 250 performs a first pass calibration to determine a first 10-bit value ("v1") corresponding to the signals (DACP1-DACref) and (DACN1-DACref) at the end of the time period t0–t1. During a time period t1–t2 (a "second pass calibration"), the offset cancellation circuitry 250 performs a second pass calibration to determine a second 10-bit value ("v2") corresponding to the signals (DACP2-DACref) and (DACN2-DACref) at the end of the time period t1–t2. The offset cancellation circuitry 252 performs the first and second pass calibration in the manner described above referring to FIGS. 1 and 2.

The primary difference between the embodiment shown in FIGS. 1 and 2, and the embodiment shown in FIGS. 3 and 4 is the driving of the signals Y and YB by the SAR engine 252. Specifically, during the first pass calibration, the SAR engine 252 sets the signals Y and YB to L, and during the second pass calibration, the SAR engine 252 sets the signals Y and YB to H. Consequently, during the first pass calibration, the signals OUTP and OUTN are at L, and during the second pass calibration, the signals OUTP and OUTN are at H.

Then, during a time period t2–t3, the SAR engine 252 obtains a third 10-bit value ("v3") corresponding to the signals (DACP3-DACref) and (DACN3-DACref) by averaging the first and second 10-bit values obtained in the first and second pass calibrations. Then, during the normal operation mode, the offset cancellation circuitry 250 applies the signals DACP3 and DACN3 corresponding to the third 10-bit value to the inputs 126 and 128, respectively. In this embodiment, the following relationship is satisfied:

$$v3=(v1+v2)/2.$$

Here, the 10-bit values v1, v2, and v3 are measured with respect to the center voltage DACref, and includes the sign with respect to the center voltage DACref.

The embodiment shown in FIGS. 3 and 4 determines the 10-bit value v3 for cancellation of the offset voltage based on the value v1 when the outputs 176 and 178 at L, and the value v2 when the outputs 176 and 178 at H. The embodiment shown in FIG. 3 does not need the controller 198 which couples the outputs OUTP and OUTN to the medium voltage point via a voltage divider (or, a resistor network). This results in omission of the voltage divider 198 shown in FIG. 1. Consequently, this embodiment may result in lower circuit complexity and cost. As indicated in FIG. 4, the filtered output at the load 180 experiences little or no glitch at the onset of amplification (i.e., the time t3). Since the voltage potential at the outputs 176 and 178 and the offset voltage have a linear relationship, calculation of the value v3 by averaging the values v1 and v2 produces a good approximation.

In a specific embodiment, when the SAR engine 252 calculates the 10-bit value v3 corresponding to the signals (DACP3-DACref) and (DACN3-DACref), the SAR engine 252 utilizes the following bit computation. First, the engine 252 adds each bit of two 10-bit words v1 and v2 generated in the first and second pass calibrations of the successive approximation. The summation for each bit corresponds to adding the two values.

Second, the engine 252 shifts each bit of the resulting 10-bit word from a higher bit to a lower bit by one bit. This one-bit shift operation corresponds to division by two. Finally, the SAR engine 252 outputs the result to the 10-bit latch 154. Thus, calculation of the value v3 using bit operations may be advantageous where simple circuitry or high-speed calculation is desirable.

In the embodiment shown in FIG. 3, the signal processor 210 includes the switch 240. However, the switch 240 may be included in any of the functional blocks of the differential amplifier 200. In some embodiments, the switch 240 can be replaced by any suitable circuitry which activates/deactivates the switches 172 and 174, thereby enabling the outputs 176 and 178 to be pulled up to H/L.

Similar to the embodiment of FIG. 1, the differential amplifier 200 includes n sets of the signal processor 210, the 10-bit latch 154, the 10-bit DAC 158, the power stage 170, the load 180, the filter 190, and associated circuitry (e.g., the resistor network including R11–R14, and the switch 240) in order to provide a system having n channels. Thus, calibration for the n channels is performed by repeating the processes during the time period t0–t3 in FIG. 4 for each of the channels before the normal operation mode starting at the time t3.

Figure 5:
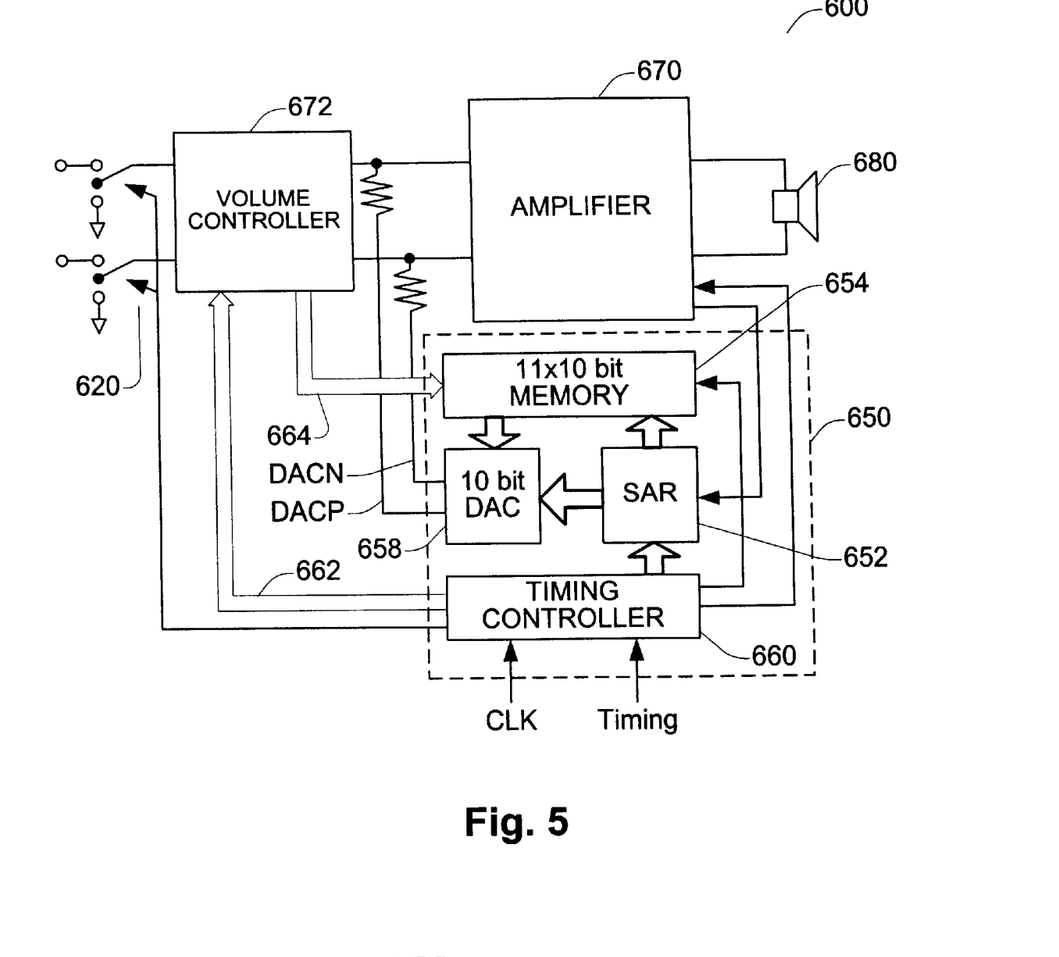
FIG. 5 is a block diagram of a differential amplifier according to still another embodiment of the present invention.

FIG. 5 is a block diagram of a differential amplifier 600 according to still another embodiment of the present invention. The differential amplifier 600 includes a switch 620, an offset cancellation circuitry 650, an amplifier 670, a volume controller 672, and a load 680. The amplifier 670 may correspond to either the combination of the signal processor 210 and the power stage 170, or the combination of the signal processor 110 and the power stage 170. Therefore, the embodiment shown in FIG. 5 can be utilized for both the embodiment shown in FIGS. 1 and 2, and the embodiment shown in FIGS. 3 and 4.

The switch 620, the offset cancellation circuitry 650, and the load 680 correspond to their counterparts illustrated in FIG. 3, and function in a similar manner described referring to FIGS. 3 and 4 with the exception that the offset cancellation circuitry 650 determines suitable offset cancellation signals based on a plurality of input levels set by the volume controller 672.

The offset cancellation circuitry 650 includes an SAR engine 652, an 11×10-bit memory 654, a 10-bit DAC 658, and a timing controller 660. The SAR engine 652, the memory 654, and the DAC 658 correspond to their counterparts illustrated in FIG. 3, and function in a similar manner described referring to FIGS. 3 and 4. The timing controller 660 generates necessary signals to control the SAR engine 652 and the volume controller 672.

When a power switch of the differential amplifier 600 is turned on, the calibration mode similar to the time period t0–t3 shown in FIG. 4 is performed by the offset cancellation circuitry 650. First, the offset cancellation circuitry 650 sets the volume level of the volume controller 672 to a level 1. Then, the offset cancellation circuitry 650 determines the 10-bit value v3 corresponding to the offset cancellation signals DACP and DACN corresponding to the level 1 of the volume controller 672. Next, the offset cancellation circuitry 650 sequentially determines the 10-bit values corresponding to levels 2–11 of the volume controller 672. The 11×10-bit memory 654 stores eleven 10-bit values for the offset cancellation signals DACP and DACN corresponding to the levels 1–11 of the volume controller 672.

In order to set the volume level at the volume controller 672, the timing controller 660 sends a volume control signal via a control bus 662. In order to feedback the current volume level of the volume controller 672, the volume controller 672 sends a volume level signal to the memory 654 via a data bus 664. The memory 654 stores eleven sets of the values DACP3 and DACN3 corresponding to the eleven volume levels 1–11 in eleven addresses.

During the normal operation mode, the offset cancellation circuitry 650 receives the volume level signal indicating the current volume level of the volume controller 672. The memory 654 retrieves the 10-bit value representing the offset cancellation signals corresponding to the volume level based on the volume level signal from the volume controller 672. Then, the DAC 658 generates the signals DACP and DACN based on the retrieved 10-bit values.

As described above, the embodiment shown in FIG. 5 may use different offset cancellation signals based on the volume level which the user changes during the normal operation mode. Since changes in the volume level may affect the balance of the two signal paths of the differential amplifier 600, this embodiment may effectively minimize the offset voltage caused by the unbalance due to a volume change.

It should be appreciated that the number of volume levels to which the values DACP3 and DACN3 correspond may be modified to any integer more than one.

Figure 6:
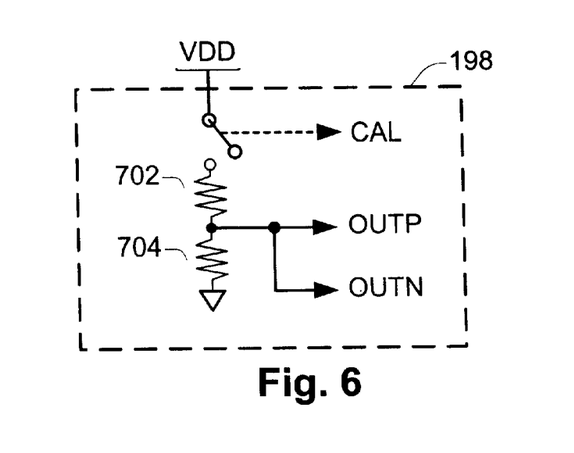
FIG. 6 is a circuit diagram illustrating a configuration of a controller used for one embodiment.

FIG. 6 is a circuit diagram illustrating a configuration of the controller 198. In some embodiments, the controller 198 includes a voltage dividing network operable to supply an intermediate voltage between the power supply voltage VDD and the ground voltage GND. When the outputs OUTP and OUTN are set to an average of the power supply voltage VDD and the ground voltage GND, resistance values of the resistors 702 and 704 need to be set to the same value.

In the foregoing description of the embodiments, the power stage 170 includes a switching amplifier, i.e., includes the switches 172 and 174 which in turn use a particular switching circuit architecture. However, the power stage 170 may include an active device which operates as a linear amplifier. For example, a pair of FETs which operate in a linear region may be used for the power stage 170. Similarly, comparators 118 of FIGS. 1 and 3 may be replaced by an analog buffering stages or may even be eliminated altogether in linear amplifier embodiments.

In this specification, the term "offset cancellation" does not necessarily mean complete elimination of the offset voltage. Stated differently, "offset cancellation" includes both substantial cancellation and partial cancellation of the offset.

Various system elements in the specification may have other names or labels other than ones indicated herein as long as their functions are substantially the same as the ones described herein. For example, the offset cancellation circuitry 150 may be implemented by any suitable circuitry which is generally called a "controller" or a "signal generator."

It should be appreciated that specific polarities (e.g., inverting and non-inverting) of various signals in the differential amplifier 110 may be modified depending on a specific circuit architecture utilized in the embodiment. Also, the details of each functional block in FIG. 1 may be modified according to, for example, various system requirements. Such details include, for example, the number of circuit elements (e.g., the operational amplifiers 112, 114, SPU 116, the switches 172 and 174, and the DACs 158–161).

In the embodiments described here, the nine bits b8–b0 in the 10-bit values stored in the offset cancellation circuitry 150 and 250 correspond to an absolute value of the signals DACP and DACN with respect to the center voltage (e.g., 2.4 V). However, in some embodiments, the nine bits b8–b0 may correspond to a peak-to-peak value between the signals DACP and DACN.

In the embodiments described above, the offset cancellation circuitry 150 and 250 determine a digital value corresponding to an offset cancellation signal during the calibration mode, and store the digital value for later use during the normal operation mode. However, the offset cancellation circuitry 150 and 250 may use any type of signal (e.g., a digital signal or an analog signal) as long as it represents or corresponds to the offset cancellation signal for cancellation of an offset voltage.

It should be appreciated that the functionality of the embodiments of the present invention can be implemented by any combination of software and/or hardware. The function blocks in the embodiments of the invention may take various forms. It may include one or more general-purpose microprocessors that are selectively configured or reconfigured to implement the functions described herein. Alternatively, it may include one or more specially designed processors or microcontrollers that contain logic and/or circuitry for implementing the functions described herein. Any of the devices serving as one of the functional blocks may be designed as general purpose microprocessors, microcontrollers (sometimes simply referred to as "controllers"), ASICs (application specific integrated circuits), DSPs (digital signal processors), PLDs (programmable logic devices), FPGAs (field programmable gate arrays), and the like. They may execute instructions under the control of the hardware, firmware, software, reconfigurable hardware, combinations of these, etc.

The hardware elements described above may be configured (usually temporarily) to act as one or more software modules for performing a part or all of the functions of embodiments of this invention. For example, separate modules may be created from program instructions for performing the functionality of the embodiments according to the present invention as described above. In appropriate cases, a part of the hardware elements in the embodiments can be omitted.

Although specific details of the signal processor 110, the power stage 170, and the like have been described, those specific circuit configurations are not particularly relevant to the present invention. Rather, other various configurations can be used for those functional blocks.

In this specification including the appended claims, the term "or" should be interpreted according to its ordinary meaning, i.e., an inclusive meaning, not an exclusive meaning. Thus, the term "or" describes a list of alternative things in which one may choose one option or any combination of alternative options irrespective of the number of options. For example, an expression "block X may be P, Q, or R" should be interpreted as "block X may be one of P, Q, R, P+Q, P+R, Q+R, and P+Q+R." This ordinary meaning of the term "or" also applies to the term "either . . . or . . . " in this specification.

While the invention has been particularly shown and described with reference to specific embodiments thereof, it will be understood by those skilled in the art that changes in the form and details of the disclosed embodiments may be made without departing from the spirit or scope of the invention. In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A differential amplifier comprising first and second outputs and first and second supply rails, the differential amplifier further comprising offset cancellation circuitry which is operable during a calibration mode to generate an offset cancellation signal when the first and second outputs are both coupled to a calibration voltage between the first supply rail and the second supply rail, the offset cancellation signal being for facilitating at least partial cancellation of an offset voltage associated with the first and second outputs during a normal operation mode of the differential amplifier.

2. The differential amplifier of claim 1, wherein the first and second supply rails supply a power supply voltage and a ground voltage, respectively, and the calibration voltage is substantially an average of the power supply voltage and the ground voltage.

3. The differential amplifier of claim 2, further comprising a voltage dividing network operable to supply the calibration voltage to the first and second outputs during the calibration mode.

4. The differential amplifier of claim 1, further comprising first and second active devices coupled to the first and second outputs, respectively, wherein each of the first and second active devices operates as a switch.

5. The differential amplifier of claim 4, wherein the first and second active devices comprise field effect transistors.

6. The differential amplifier of claim 4, wherein the first and second active devices comprise bipolar transistors.

7. The differential amplifier of claim 1, further comprising first and second active devices coupled to the first and second outputs, respectively, wherein each of the first and second active devices operates as a linear amplifier.

8. The differential amplifier of claim 1, further comprising:
   a signal processor block for receiving an input of the differential amplifier and the offset cancellation signal, and outputting an output signal;
   comparator circuitry for converting the output signal into a binary signal; and
   a switching amplifier for amplifying the binary signal, and generating the first and second outputs.

9. The differential amplifier of claim 8, wherein the first and second outputs are configured to drive a loudspeaker.

10. The differential amplifier of claim 8, wherein the first and second outputs are configured to drive a motor.

11. The differential amplifier of claim 8, wherein the differential amplifier includes a plurality of sets of the signal processor block, the comparator circuitry, and the switching amplifier corresponding to a plurality of channels.

12. The differential amplifier of claim 11, wherein the offset cancellation circuitry is operable to generate a plurality of the offset cancellation signals corresponding to the plurality of channels.

13. The differential amplifier of claim 1, wherein the offset cancellation circuitry includes:
   a successive approximation type analog-to-digital converter for generating offset compensation data based on the offset voltage; and
   a digital-to-analog converter for receiving the offset compensation data, generating an offset compensation voltage based on the offset compensation data, and applying the offset compensation voltage to an input of the differential amplifier.

14. The differential amplifier of claim 13, wherein the offset cancellation signal corresponds to an n-bit word, where n is at least 2.

15. The differential amplifier of claim 1, wherein the offset cancellation signal is a voltage signal.

16. The differential amplifier of claim 1, wherein the offset cancellation signal is a current signal.

17. The differential amplifier of claim 1, wherein the offset cancellation circuitry is operable to generate a plurality of the offset cancellation signals based on a plurality of levels of an input of the differential amplifier.

18. A differential amplifier comprising first and second outputs and first and second supply rails, the differential amplifier further comprising offset cancellation circuitry which is operable during a calibration mode to generate a first offset cancellation signal when the first and second outputs are coupled to the first supply rail, and a second offset cancellation signal when the first and second output are coupled to the second supply rail, the offset cancellation circuitry also being operable during the calibration mode to generate a third offset cancellation signal by averaging the first and second offset cancellation signals, the third offset cancellation signal being for facilitating at least partial cancellation of an offset voltage associated with the first and second outputs during a normal operation mode of the differential amplifier.

19. The differential amplifier of claim 18, wherein the first and second supply rails supply a power supply voltage and a ground voltage, respectively.

20. The differential amplifier of claim 18, further comprising a controller operable to couple the first and second outputs to one of the first and second supply rails during the calibration mode.

21. The differential amplifier of claim 18, further comprising first and second active devices coupled to the first and second outputs, respectively, wherein each of the first and second active devices operates as a switch.

22. The differential amplifier of claim 21, wherein the first and second active devices are field effect transistors.

23. The differential amplifier of claim 21, wherein the first and second active devices are bipolar transistors.

24. The differential amplifier of claim 18, further comprising first and second active devices coupled to the first and second outputs, respectively, wherein each of the first and second active devices operates as a linear amplifier.

25. The differential amplifier of claim 18, further comprising:
   a signal processor block for receiving an input of the differential amplifier and the offset cancellation signal, and outputting an output signal;
   comparator circuitry for converting the output signal into a binary signal; and
   a switching amplifier for amplifying the binary signal, and generating the first and second outputs.

26. The differential amplifier of claim 25, wherein the first and second outputs are configured to drive a loudspeaker.

27. The differential amplifier of claim 25, wherein the first and second outputs are configured to drive a motor.

28. The differential amplifier of claim 25, wherein the differential amplifier includes a plurality of sets of the signal processor block, the comparator circuitry, and the switching amplifier corresponding to a plurality of channels.

29. The differential amplifier of claim 28, wherein the offset cancellation circuitry is operable to generate a plurality of the offset cancellation signals corresponding to the plurality of channels.

30. The differential amplifier of claim 18, wherein the offset cancellation circuitry includes;
   a successive approximation type analog-to-digital converter for generating first offset compensation data based on the offset voltage corresponding to a condition in which the first and second outputs are coupled to the first supply rail, and generating second offset compensation data based on the offset voltage corresponding to a condition in which the first and second outputs are coupled to the second supply rail, and a digital-to-analog converter for receiving the first and second offset compensation data, generating average offset compensation data corresponding to an average value of the first and second offset compensation data, generating an average offset compensation voltage based on the average offset compensation data, and applying the average offset compensation voltage to an input of the differential amplifier.

31. The differential amplifier of claim 30, wherein the offset cancellation signal corresponds to an n-bit word, where n is at least 2.

32. The differential amplifier of claim 18, wherein the offset cancellation signal is a voltage signal.

33. The differential amplifier of claim 18, wherein the offset cancellation signal is a current signal.

34. The differential amplifier of claim 18, wherein the offset cancellation circuitry is operable to generate a plurality of the offset cancellation signals based on a plurality of levels of an input of the differential amplifier.

35. A method for reducing an offset voltage of a differential amplifier, the differential amplifier including first and second outputs and first and second supply rails, comprising:

generating an offset cancellation signal when the first and second outputs are both coupled to a voltage between the first supply rail and the second supply rail during a calibration mode of the differential amplifier; and applying the offset cancellation signal to an input of the differential amplifier for facilitating at least partial cancellation of the offset voltage associated with the first and second outputs during a normal operation mode of the differential amplifier.

36. The method of claim 35, wherein the first and second supply rails supply a power supply voltage and a ground voltage, respectively, and the voltage is substantially an average of the power supply voltage and the ground voltage.

37. A method for reducing an offset voltage of a differential amplifier, the differential amplifier including first and second outputs and first and second supply rails, comprising:

generating a first offset cancellation signal when the first and second outputs are coupled to the first supply rail, and a second offset cancellation signal when the first and second output are coupled to the second supply rail during a calibration mode of the differential amplifier;

generating a third offset cancellation signal by mathematically combining the first and second offset cancellation signals; and applying the third offset cancellation signal to an input of the differential amplifier for facilitating at least partial cancellation of the offset voltage associated with the first and second outputs during a normal operation mode of the differential amplifier.

38. The method of claim 37, wherein the first and second supply rails supply a power supply voltage and a ground voltage, respectively.

39. The method of claim 37, wherein mathematically combining the first and second offset cancellation signals comprises computing an average of the first and second offset cancellation signals.

40. An electronic device comprising the differential amplifier of claim 1.

41. An electronic device comprising the differential amplifier of claim 18.

* * * * *